(12) United States Patent
Nakayama et al.

(10) Patent No.: US 7,612,334 B2
(45) Date of Patent: Nov. 3, 2009

(54) STANDARD REFERENCE COMPONENT FOR CALIBRATION, FABRICATION METHOD FOR THE SAME, AND SCANNING ELECTRON MICROSCOPE USING THE SAME

(75) Inventors: Yoshinori Nakayama, Sayama (JP); Yasunari Sohda, Kawasaki (JP); Keiichiro Hitomi, Kokubunji (JP); Hajime Koyanagi, Koshigaya (JP)

(73) Assignee: Hitachi High-Technologies Corporation, Tokyo (JP)

( * ) Notice: Subject to any disclaimer, the term of this patent is extended or adjusted under 35 U.S.C. 154(b) by 160 days.

(21) Appl. No.: 11/939,596

(22) Filed: Nov. 14, 2007

(65) Prior Publication Data

US 2008/0121791 A1 May 29, 2008

(30) Foreign Application Priority Data

Nov. 27, 2006 (JP) ............................... 2006-319191

(51) Int. Cl.
*H01J 37/26* (2006.01)
*H01J 37/28* (2006.01)
*G01D 18/00* (2006.01)

(52) U.S. Cl. .................... 250/252.1; 250/311; 250/310; 250/306; 250/307; 250/396 R; 250/398; 257/429

(58) Field of Classification Search .............. 250/252.1, 250/311, 310, 306, 307, 396 R, 398; 257/429
See application file for complete search history.

(56) References Cited

U.S. PATENT DOCUMENTS

| | | | | |
|---|---|---|---|---|
| 5,557,105 A | * | 9/1996 | Honjo et al. | 250/310 |
| 2002/0130262 A1 | * | 9/2002 | Nakasuji et al. | 250/311 |
| 2008/0210867 A1 | * | 9/2008 | Hitomi et al. | 250/311 |
| 2008/0251868 A1 | * | 10/2008 | Nakayama et al. | 257/429 |

OTHER PUBLICATIONS

Misumi et al. "2006 The Japan Society of Precision Engineering (JSPE) Spring Meeting, Technical Digest," pp. 1091.

* cited by examiner

*Primary Examiner*—Nikita Wells
(74) *Attorney, Agent, or Firm*—Antonelli, Terry, Stout & Kraus, LLP.

(57) ABSTRACT

The present invention provides a standard reference component for calibration for performing magnification calibration used in the scanning electron microscope with high precision, and provides a scanning electron microscope technique using it. Provided is a standard reference component for calibration for calibrating a scanning electron microscope that measures a length of a pattern in an observation area from information on the intensity of secondary electrons or reflected electrons generated by scanning an incident electron beam in the observation area on a measuring sample, having: a first substrate on which a multiple-layer is laminated and a second substrate with a recess for holding the first substrate, wherein the first substrate is held in the recess of the second substrate so that a normal direction of the multiple-layer surface may be roughly perpendicular to a normal direction of the second substrate surface, and the multiple-layer has a multiple-layer structure of a film containing silicon and a film containing molybdenum.

15 Claims, 7 Drawing Sheets

FIG.1

ENLARGED VIEW

STANDARD REFERENCE COMPONENT FOR CALIBRATION, FABRICATION METHOD FOR THE SAME, AND SCANNING ELECTRON MICROSCOPE USING THE SAME

CLAIM OF PRIORITY

The present invention claims priority from Japanese application JP 2006-319191, filed on Nov. 27, 2006, the content of which is hereby incorporated by reference on to this application.

BACKGROUND OF THE INVENTION

The present invention relates to a standard reference for calibrating a scanning electron microscope, a fabrication method therefor, and a scanning electron microscope using it.

In recent years, miniaturization is proceeding in the semiconductor device increasingly, which requires higher-precision dimensional control. Accordingly, in the field of fabrication of the semiconductor device, dimensional control using an electron-beam length measurement apparatus based on the scanning electron microscope is being practiced. Measurement precision of this dimensional control is determined by precision of magnification calibration of the scanning electron microscope.

However, when measurement at higher magnifications is performed in response to the miniaturization of the semiconductor device, a pattern of a standard reference with which magnification calibration is performed is required to have a micro-precision feature comparable to the semiconductor pattern or higher because the field of view of the scanning electron microscope has a narrow area. To respond to this requirement, as a calibration reference having the micro-precision feature with a pitch size of 100 nm or less, a super lattice sample as shown in Misumi et al. "2006 The Japan Society of Precision Engineering (JSPE) Spring Meeting, Technical Digest," pp. 1091 is proposed.

SUMMARY OF THE INVENTION

However, when the calibration reference of the conventional technology as described above is used for magnification calibration of the scanning electron microscope, it gives the following problems.

To begin with, the first problem is that since a GaAs compound semiconductor is used for a super lattice material, the GaAs compound becomes an impurity element to a silicon wafer, and if it is mounted on the same stage as that for the silicon wafer, it will contaminate the silicon wafer.

Second, if a cross-section sample is used, a level difference is generated between it and a substrate surface when it is implanted in the substrate. Since in the scanning electron microscope, it is necessary to impress a voltage to the sample side, so that an acceleration voltage of the electron beam is controlled, if the level difference exists, a localized surface electric field distribution will be generated at the level difference part and astigmatic shift will occur. As a result, calibration precision will deteriorate. As means for eliminating the level difference after implanting the cross-section sample in the substrate, a method for polishing the surface can be considered. However, since polishing introduces contamination of the GaAs semiconductor compound into the substrate, the method has a problem that the sample cannot be mounted on the same stage as for the wafer.

Moreover, although $Si/SiO_2$ is proposed as a material other than the GaAs semiconductor compound, when it is used for magnification calibration in the scanning electron microscope, the method has a problem of deteriorating calibration precision because electrification is generated to an electron beam.

Then, the object of the present invention is to provide a standard reference component for calibration for performing magnification calibration used in the scanning electron microscope with high precision and to provide a scanning electron microscope technique using it.

In order to attain the object, the present invention specifies the standard reference component to employ a basic configuration of a multiple-layer structure composed of silicon/molybdenum (Si/Mo) as a super lattice multilayer crystal.

Further, after implanting this cross-section in the silicon wafer, the cross-section part and the substrate part are flattened by polishing the surface, and finally material selecting etching is conducted to fabricate the standard reference component. A lamination period of this standard reference component is obtained in advance by light- or X-ray diffraction and the standard reference component is mounted on the scanning electron microscope. Magnification calibration of the scanning electron microscope is performed by comparing the lamination period measurement result by the scanning electron microscope with the lamination period obtained by the light- or X-ray diffraction.

Hereafter, examples of characteristic configurations included in the present invention will be enumerated.

(1) A standard reference component for calibration of the present invention being a standard reference component for calibration for calibrating a scanning electron microscope that measures a length of a pattern in an observation area from information on the intensity of secondary electrons or reflected electrons generated by scanning an incident electron beam in the observation area on an object to be inspected, having a first substrate on which a multiple-layer is laminated and a second substrate with a recess for holding the first substrate on its surface, characterized in that the first substrate is held in the recess of the second substrate so that a normal direction of the multiple-layer may be roughly perpendicular to a normal direction of the second substrate, and the multiple-layer has a multiple-layer structure of a film containing silicon and a film containing molybdenum.

(2) The standard reference component for calibration of the above-mentioned structure, characterized in that the multiple-layer has a lamination structure in which the film containing silicon and the film containing molybdenum are alternately arranged periodically at a fixed pitch and the pitch size is obtained in advance by the light- or X-ray diffraction.

(3) The standard reference component for calibration of the above-mentioned structure, characterized in that the second substrate has the form of a silicon wafer and has a structure in which the multiple-layer is implanted in the silicon wafer so that a cross-section of the multiple-layer held in the recess of the second substrate may become substantially the same plane as the surface of the silicon wafer.

(4) The standard reference component for calibration of the above-mentioned structure, characterized in that the multiple-layer structure is a periodic convex pattern of the molybdenum films or the silicon films.

(5) A fabrication method for the standard reference component for calibration of the present invention, comprising the steps of: arranging a silicon film and a molybdenum film periodically to form a multiple-layer structure of the two films at fixed pitch; implanting the crystal cross-section of the multiple-layer structure in the recess formed on the surface of the silicon wafer with an electroconductive adhesive; polishing the surface of the silicon wafer in which the crystal cross-section of the multiple-layer structure is implanted; and forming the crystal cross-section of the multiple-layer structure into a one-dimensional diffraction grating pattern form by material selecting etching.

(6) The scanning electron microscope of the present invention, having: a sample stage for holding a sample; an irradiation optical system for scanning an electron beam in the sample on the sample stage; a detector for detecting secondary electrons or reflected electrons generated by electron beam scanning; signal processing means for measuring the length of the sample by processing an electronic signal obtained from the detector; display means for displaying a length measurement result; and a standard reference component for calibration used for performing magnification calibration of the irradiation optical system from information on the intensity of the secondary electrons or reflected electrons; characterized in that the standard reference component for calibration substantially consists of a first substrate on which a multiple-layer is laminated and a second substrate with a recess for holding the first substrate on its surface, the first substrate is held in the recess of the second substrate so that a normal direction of the multiple-layer surface may be roughly perpendicular to a normal direction of the second substrate surface, and the multiple-layer has a multiple-layer structure of a film containing silicon and a film containing molybdenum.

(7) The scanning electron microscope of the above-mentioned configuration, characterized in that the multiple-layer has a lamination structure in which a film containing silicon and a film containing molybdenum are alternately arranged periodically at a fixed pitch, and the pitch size is obtained in advance by the light- or X-ray diffraction.

(8) The scanning electron microscope of the above-mentioned configuration, characterized in that by comparing a pitch size of either film obtained by the signal processing means and a pitch size obtained in advance by the light- or X-ray diffraction, the magnification calibration of the irradiation optical system is performed so that the difference may become substantially zero.

(9) The scanning electron microscope of the above-mentioned configuration, characterized in that the standard reference component for calibration is mounted on the sample stage.

According to the present invention, a scanning electron microscope technique including the standard reference component for calibration for performing magnification calibration used in the scanning electron microscope with high precision can be provided.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Hereafter, embodiments of the present invention will be described in detail with reference to the drawings.

First Embodiment

Figure 1:
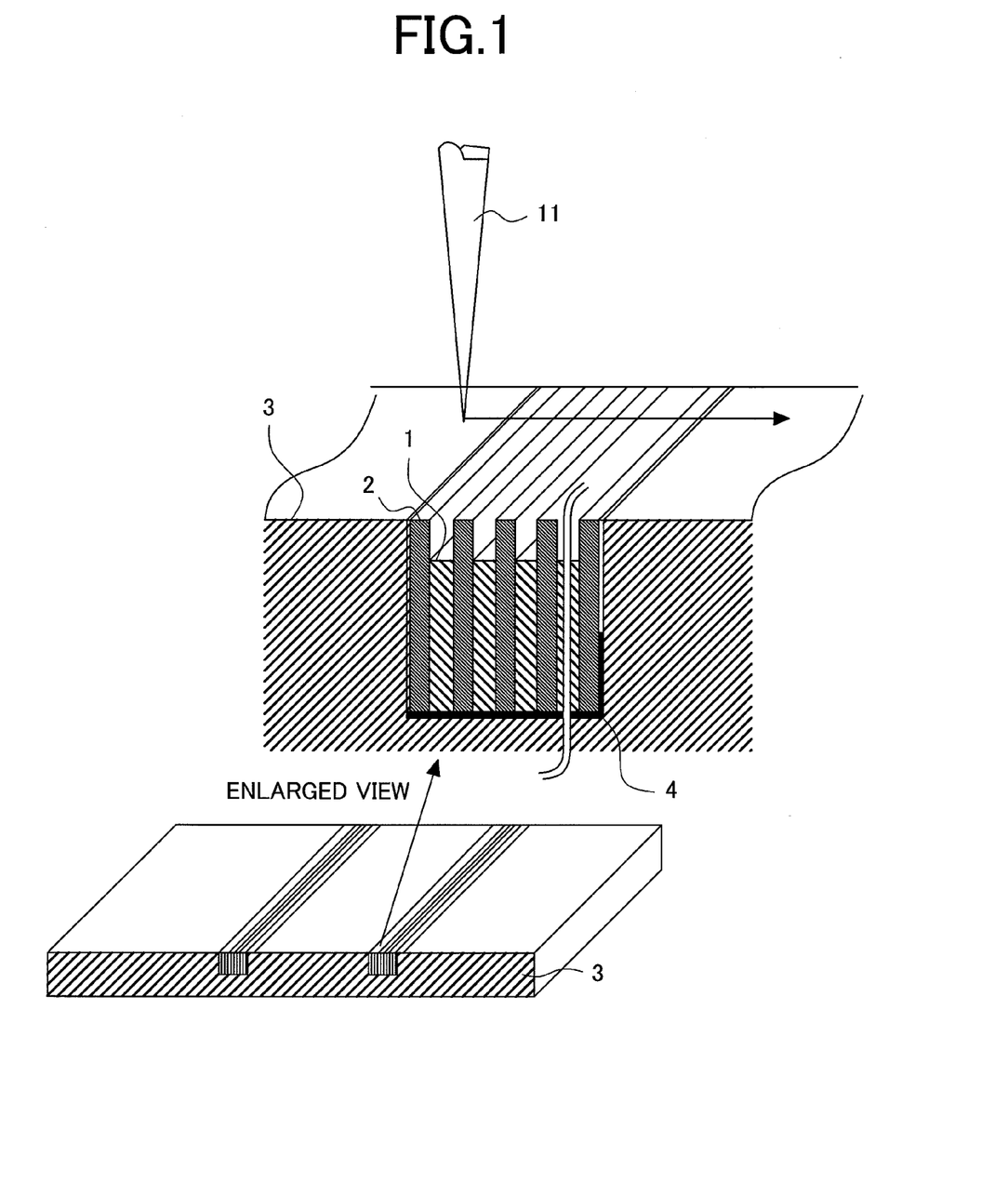
FIG. 1 is a schematic diagram of a standard reference component of the present invention.
Figure 2:
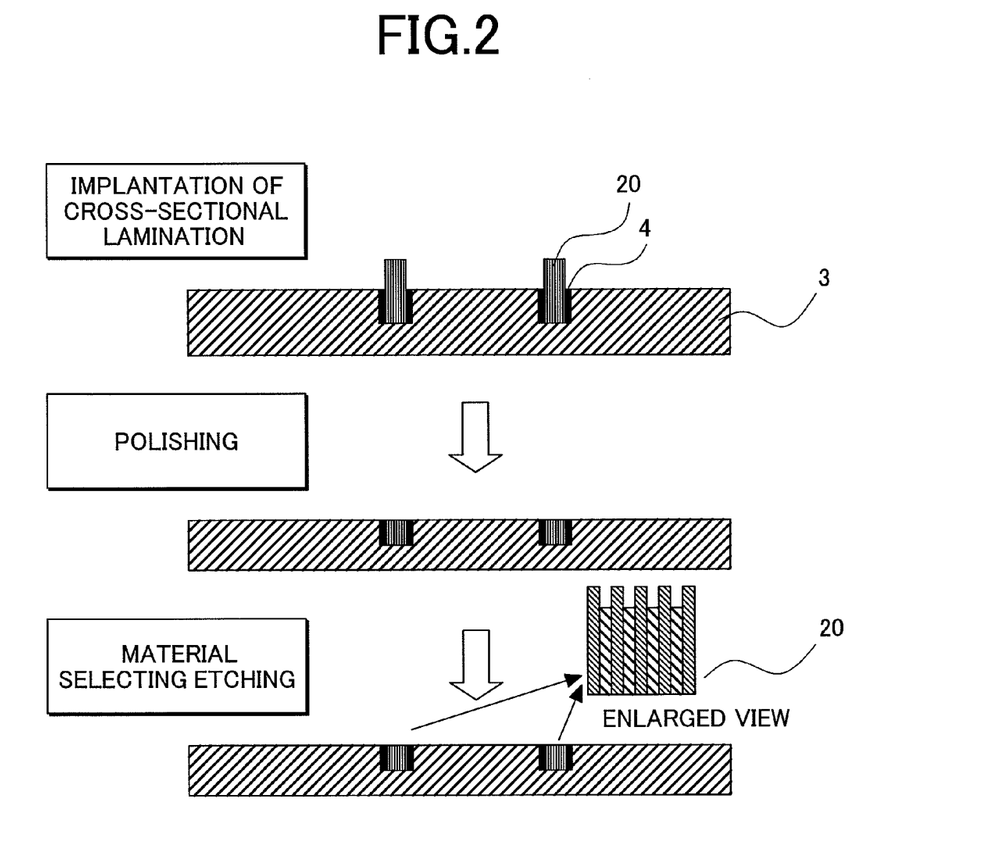
FIG. 2 is a diagram for explaining a fabrication method for the standard reference component of the present invention.

FIG. 1 is a schematic diagram of a standard reference component having a lamination structure of silicon/molybdenum (Si/Mo) of the present invention, and FIG. 2 shows a fabrication method therefor.

A lamination of silicon/molybdenum that works as a calibration part is formed to have 40 layers of the two layers each 10 nm in thickness by ion beam film deposition, and a silicon layer 1 is etched by a depth of about 10 nm by material selecting etching to form a periodic convex pattern of molybdenum layers 3.

As shown in FIG. 2, first, a lamination layer of silicon/molybdenum is 40 layers of the two films each 10 nm in thickness alternately formed on a silicon substrate layer, which is cut therefrom in a width of 1 mm, is implanted in a recess of a depth of 500 μm of a silicon substrate 3 for holding, 800 μm in thickness and 300 mm in diameter, with its cross-section disposed on the surface side, and is fixed with an electroconductive adhesive 4. Next, the silicon substrate for holding is polished until the thickness becomes 775 μm. As a result, the silicon substrate for holding and a cross-sectional lamination surface of silicon/molybdenum become substantially the same plane with a level difference within 1 μm. Finally, the silicon layer 1 is etched by about 10 nm by material selecting etching with a potassium hydroxide solution or the like and a periodic convex pattern (one-dimensional diffraction grating pattern) of a molybdenum layer 2 is formed.

In this stage, if the fabrication method is used in the GaAs system super lattice as is practiced in the conventional technique, III group and V group elements that work as dopants to the silicon semiconductor will diffuse into the holding substrate during the polishing and contaminate the holding substrate. Therefore, if the silicon semiconductor wafer or the like is mounted on a same stage 13 of the scanning electron microscope shown in FIG. 3, Ga or As will remain on the stage surface and the remaining Ga or As will diffuse into the silicon semiconductor wafer to be measured, which will cause contamination.

On the other hand, since heavy metal elements, such as tungsten (W), tantalum (Ta), and molybdenum (Mo), are not dopants to the silicon semiconductor, there is no effect of contamination. In this embodiment, although illustration is given by taking molybdenum as an example, use of tungsten and tantalum is also applicable.

Figure 3:
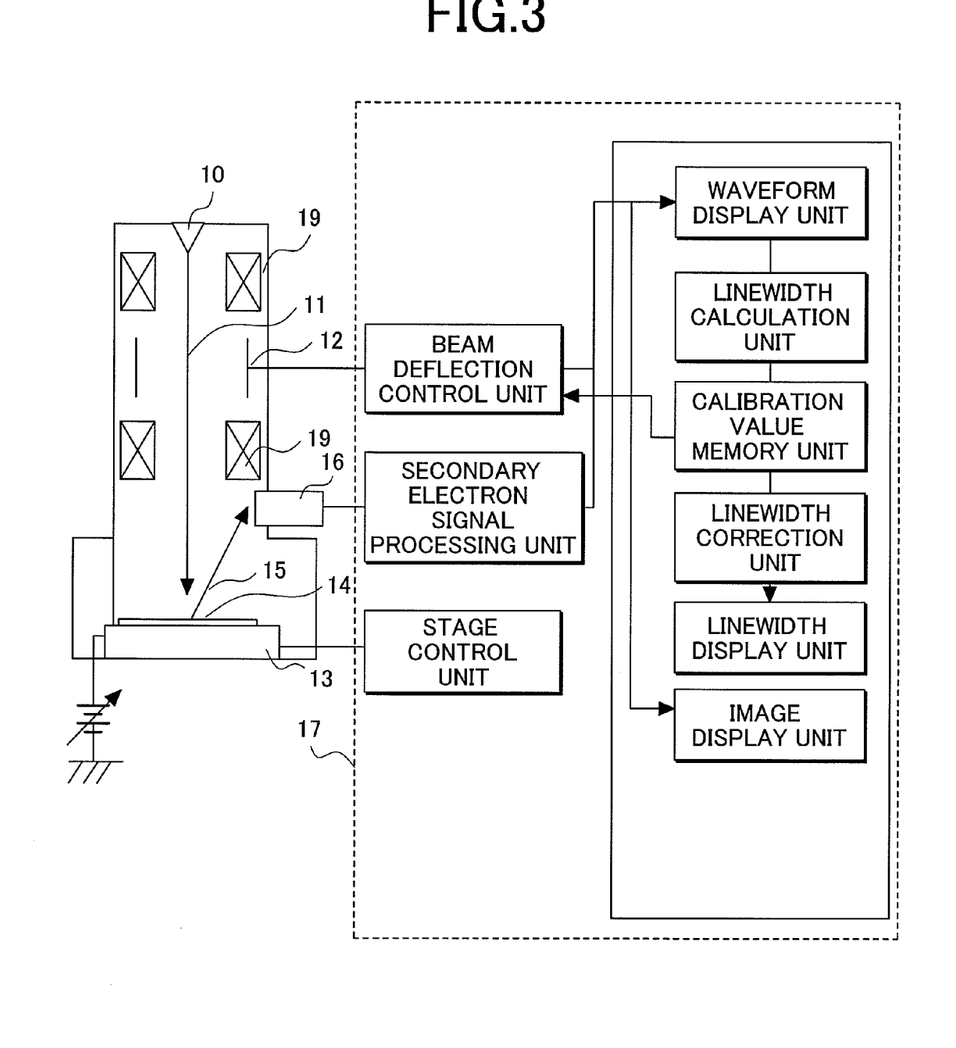
FIG. 3 is a diagram for explaining the system configuration of the scanning electron microscope according to the present invention.
Figure 4:
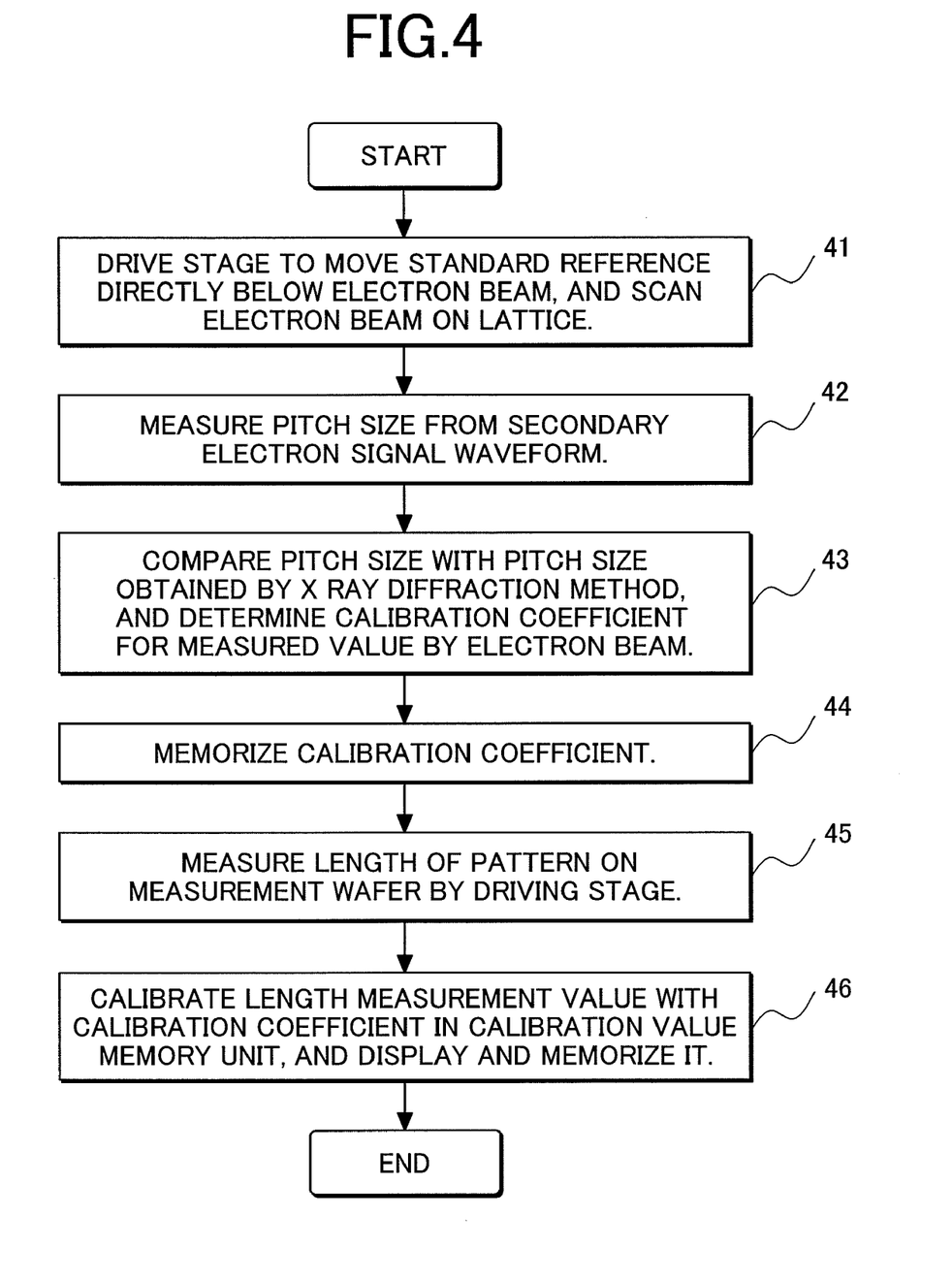
FIG. 4 is a flowchart at the time of performing magnification calibration by the present invention.

An example in which a standard reference component having a lamination structure of silicon/molybdenum (Si/Mo) described above is mounted on the scanning electron microscope will be explained. FIGS. 3 and 4 are a schematic diagram showing a system configuration of the scanning electron microscope according to the present invention and a diagram showing a flow of apparatus calibration, respectively.

An electron beam 11 emitted from the electron gun (electron source) 10 is scanned on the sample by a lens 19 and a deflector 12. The stage 13 has a measuring sample (wafer) on it. In order to control a beam acceleration voltage, a voltage for this purpose is impressed to the stage 13. Moreover, based on a signal from an electron detector 16 for detecting secondary electrons 15 generated by electron beam irradiation, display of a secondary electron (or reflection electron) image or secondary electron signal waveform and length measurement are performed. The stage position at that time is detected and controlled by a stage control unit. Here, although FIG. 3 shows a configuration in which a control system 17 includes each operation unit, a control unit, a display unit, etc.; the control system 17 is not necessarily required to include any one of them.

In FIGS. 3 and 4, first, the stage 13 is moved, a wafer-type standard reference component 18 having the lamination structure of silicon/molybdenum (Si/Mo) is mounted on the stage 13 using a same conveyance system as is used for a mount method of a measuring wafer, and is made to be located right under the electron beam 11 (Step 41). A voltage of minus 1.5 kV is impressed to the stage 13 so that the acceleration voltage of the beam may become 500V. A linewidth calculation unit finds a pitch size from the secondary electron signal waveform in the waveform display unit that is obtained by putting a secondary electron signal—obtained by scanning an electron beam in the lamination one-dimensional diffraction grating pattern of silicon/molybdenum (Si/Mo) perpendicular to the beam scanning—through a secondary electron signal processing unit (Step 42). Next, a linewidth correction unit compares the pitch size obtained by the linewidth calculation unit and a pitch size 20.05 nm that is obtained in advance by X-ray diffraction method and is stored in the memory unit, and determines a calibration coefficient for a measured value by electron beam (Step 43). Correction is performed in a beam deflection control unit so that the difference may become zero, and the calibration coefficient is stored in a calibration value memory unit (Step 44).

On the other hand, the sample stage 13 is driven, the length of a pattern on the measuring wafer is measured (Step 45), the length measurement value is calibrated with the calibration coefficient in the calibration value memory unit, and they are displayed on a linewidth display unit and an image display unit and are stored (Step 46).

Since the silicon holding substrate and the cross-sectional lamination surface of silicon/molybdenum are substantially on the same plane with a level difference within 1 µm, there is no disturbance in the surface electric field by a voltage of minus 1.5 kV impressed to the stage and no astigmatism is generated under the beam conditions on the wafer surface. As a result, a calibration precision of 0.5 nm or less was obtained. Moreover, mounting this standard reference on a different electron beam length measurement apparatus and performing calibration using the one-dimensional diffraction grating pattern in the same location made it possible to perform calibration similarly with a precision of 0.5 nm or less. As a result, an equipment difference of length measurement result between the two apparatuses of 1.0 nm or less was obtained.

Moreover, since the height of the cross-sectional lamination surface of silicon/molybdenum is 775 µm and the height of the silicon wafer to be measured is 775±5 µm, giving a height error as small as 5 µm, probability of the actual length measurement of the silicon wafer surface pattern obtained after the calibration was 0.1 nm or less.

On the other hand, in the case of the standard reference component of the conventional technique, since a distance between the level difference of a super lattice cross-section part and a one-dimensional diffraction grading pattern is as close as within 1 mm, an effect of disturbance in the surface electric field caused by a voltage of minus 1.5 kV impressed to the stage generates astigmatism in the beam; therefore, a calibration error became 1 nm or more. Furthermore, in the case where the recess is formed by mechanical processing or etching in the wafer without conducting surface polishing and the chip is implanted therein, a level difference of the silicon wafer to be measured is 775±5 µm, producing a height error of about 10 µm, so that the probability of the length measurement of the silicon wafer surface pattern that was measured with a calibration coefficient obtained after the calibration was 1 nm or more.

High precision calibration of the present invention described above also includes the following effects. That is, since with a lamination of silicon/molybdenum (Si/Mo) of the present invention, a difference of atomic number is as large as 16/42 as a combination of different element materials compared GaAs/InGaP and $Si/SiO_2$ that are with the conventional techniques, and accordingly the secondary electron signal ratio also becomes large; the secondary electron signal contrast in the lamination part is improved. In addition, the lamination of the present invention does not contain insulating materials, such as $Si/SiO_2$, there is no effect of electrification and measurement reproducibility of the pitch size is improved. Therefore, as an average for fixed times of measurement, an error of the average value becomes small, and in the calibration at a fixed error, there is an effect of being able to reduce the number of times of measurement.

Moreover, the standard reference according to the present invention is not restricted to the scanning electron microscope for length measurement shown in FIG. 3, but is applicable to other electron beam apparatuses.

Second Embodiment

Figure 5:
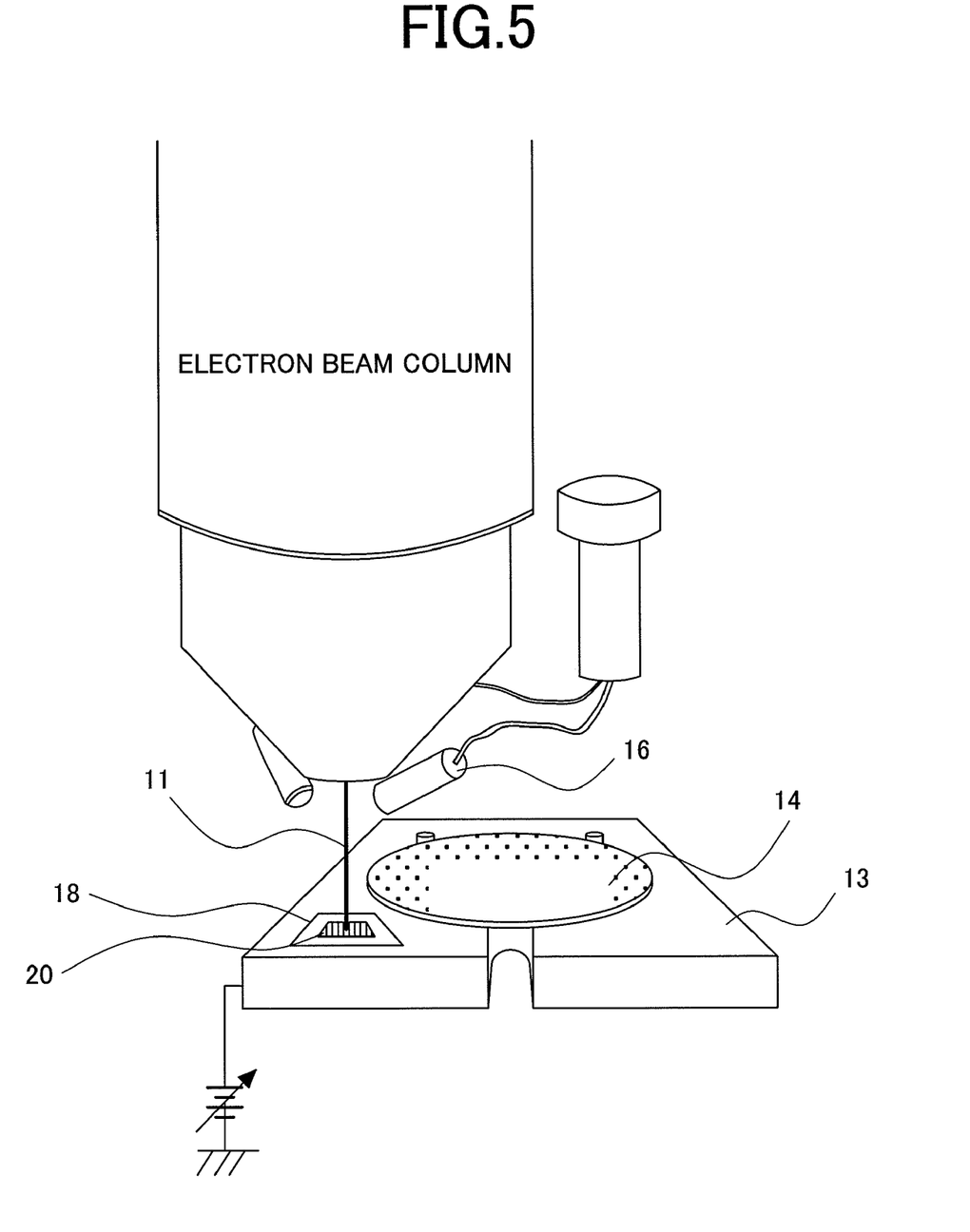
FIG. 5 is a diagram for explaining another embodiment of a system configuration of the scanning electron microscope according to the present invention.

Next, another embodiment in which the standard reference component having the lamination structure of silicon/molybdenum (Si/Mo) is mounted on the stage of the scanning electron microscope, and thereby calibration is performed will be described. FIG. 5 is a schematic diagram of a system configuration of a scanning electron microscope according to the present invention.

The electron beam 11 emitted from an electron gun in an electron beam column is scanned on the sample by a lens and a deflector (not illustrated). The stage 13 has the measuring sample (wafer) 14 on it. A voltage is impressed to the stage 13 in order to control the beam acceleration voltage. Moreover, based on a signal from the electron detector 16 for detecting the secondary electrons 15 generated by electron beam irradiation, a secondary electron image or a secondary electron signal waveform is displayed and length measurement is performed. A stage position at that time is detected and controlled by the stage control unit. Here, although FIG. 5 shows a configuration in which the control system includes a calculation unit, a control unit, a display unit, etc., like the case of FIG. 3; the control system is not necessarily required to include any one of them.

In FIG. 5, the standard reference component 18 having the lamination structure of silicon/molybdenum (Si/Mo) is installed at a position near the measuring wafer on the stage 13. By moving the stage 13, the standard reference component 18 having the lamination structure part 20 of silicon/molybdenum (Si/Mo) is made to be located right under the electron beam 11. A voltage of minus 1.5 kV is impressed to the stage 13 so that the acceleration voltage of the beam may become 500 V. The linewidth calculation unit finds a pitch size from the secondary electron signal waveform in the waveform display unit that is obtained by putting secondary electrons—obtained by scanning an electron beam in the lamination one-dimensional diffraction grating pattern of silicon/molybdenum (Si/Mo) perpendicular to the beam scanning—through the secondary electron signal processing unit. The linewidth correction unit compares a pitch size obtained by the linewidth calculation unit and a pitch size 20.05 nm that is obtained in advance by the X-ray diffraction method and is stored in the memory unit, and stores a calibration coefficient such that the difference may become zero in the calibration value memory unit.

Regarding the standard reference component 18 having the lamination structure part 20 of silicon/molybdenum (Si/Mo), a chip 18 cut to 15 mm squares from the wafer-type standard reference component fabricated by the same fabrication method as the first embodiment is glued on the stage 13 with the electroconductive adhesive. The cross-sectional lamination surface of silicon/molybdenum disposed in the central part of the chip 18 and the silicon holding substrate are substantially on the same plane with a level difference within 1 µm. Therefore, there was no disturbance of the surface electric field by the electric voltage of minus 1.5 kV impressed to the stage like the wafer-type standard reference component of the first embodiment, and astigmatism was not generated even on the cross-sectional lamination surface of silicon/molybdenum on the chip under beam conditions on the measuring wafer surface. As a result, a calibration precision of 0.5 nm or less was obtained.

Thus, by always mounting the standard reference component on the apparatus, the calibration can be performed at any time including a state in which the measuring wafer is mounted, and a probability when a pattern length measurement value of the actual silicon surface was calibrated in the linewidth correction unit using a calibration coefficient stored by calibration was 0.1 nm or less. A linewidth value after calibration is displayed on the linewidth display unit, and an electron microscope image is displayed on the image display unit.

Moreover, the standard reference component according to the present invention is not restricted to the apparatus shown in FIG. 5 but is applicable to other electron beam apparatuses.

Third Embodiment

As an embodiment of the present invention, another example of the standard reference fabrication will be described.

Figure 6:
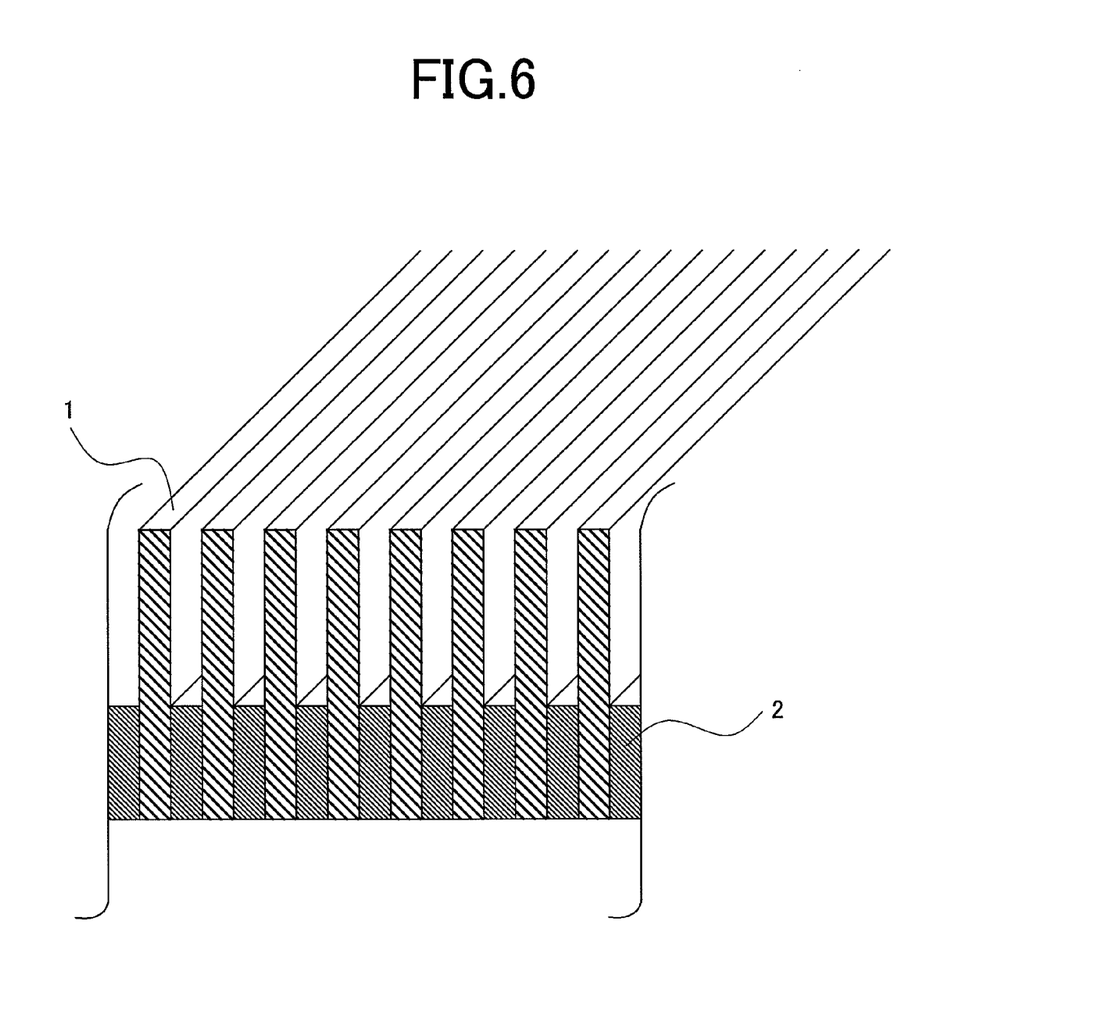
FIG. 6 is a schematic diagram for explaining another embodiment of the standard reference of the present invention.
Figure 7:
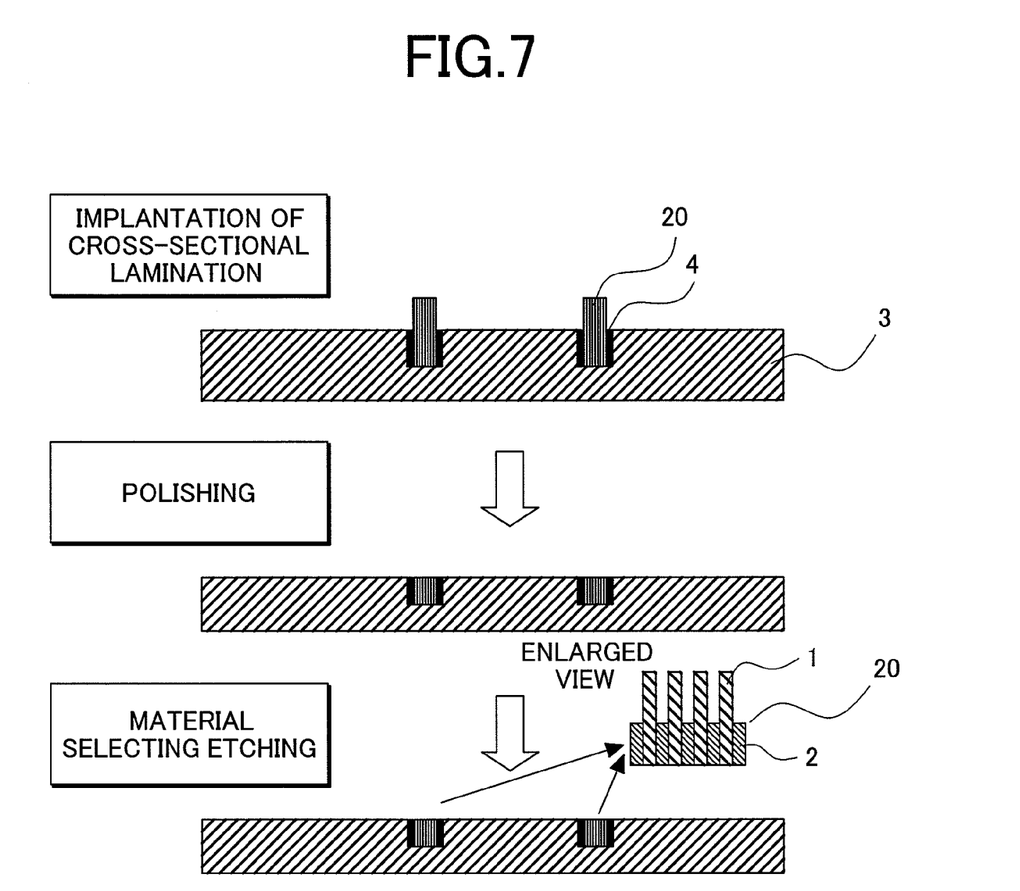
FIG. 7 is a diagram for explaining another example of a fabrication method for a standard reference of the present invention.

FIG. 6 is a schematic diagram of a standard reference component having the lamination structure of silicon/molybdenum (Si/Mo) of the present invention, and FIG. 7 shows a fabrication method therefor.

In the lamination of silicon/molybdenum used as a calibration part, a lamination of 40 layers each 10 nm in thickness are formed by ion beam film deposition is subjected to material selecting etching such as with aqueous ammonia to effect etching on the molybdenum layer 2 by a depth of about 20 nm to form a periodic convex pattern of the silicon layers 1. Since the Young's modulus of the silicon layer 1 is large, even when the molybdenum layer 2 was etched largely as much as about 20 nm in depth, the molybdenum did not fall or bend; therefore, a deeper slot structure than the first embodiment was able to be realized.

The fabrication method for the standard reference component in this example will be explained below. As shown in FIG. 7, first, the silicon substrate 3 on which 40 layers of silicon/molybdenum each 10 nm in thickness are alternately formed by ion beam film deposition to form a lamination layer is cut with a thickness of 1 mm, the cut piece is implanted in a recess 500 µm deep of a silicon substrate 800 µm in thickness and 300 nm in diameter for holding it and is fixed with the electroconductive adhesive. Next, the holding substrate is polished until the thickness becomes 775 µm. As a result, the silicon holding substrate and the cross-sectional lamination surface of silicon/molybdenum have substantially the same plane with a level difference within 1 µm. Finally, with a material selecting etchant like aqueous ammonia, the molybdenum layer is etched by a depth of about 20 nm to form a periodic convex pattern of the silicon layers.

Here, in the GaAs system super lattice as in the conventional technique, if the above-mentioned fabrication method is used, III group and V group elements that work as dopants to silicon semiconductor diffuse into the holding substrate at the time of polishing and contaminate the holding substrate. Therefore, if this substrate is mounted on the same stage on which a silicon semiconductor wafer or the like is measured, Ga or As that remains in the stage surface will diffuse into the silicon semiconductor wafer to be measured and contaminate it.

On the other hand, heavy metal elements, such as tungsten (W) and tantalum (Ta) as well as molybdenum (Mo), do not work as dopants to silicon semiconductor, and consequently there is no effect of contamination.

High-precision calibration using the standard reference component of the present invention described above has the following effect. That is, although with the periodic convex pattern of the silicon layers by the lamination of silicon/molybdenum (Si/Mo) of the present invention, the effect of the difference of atomic number as a combination of different element materials like the first embodiment is small because the convex pattern is made of a light element, being equivalent to GaAs/InGaP and Si/SiO$_2$ of the conventional technique, the secondary electron signal contrast in the lamination part by a deep slot structure having an aspect ratio of 2 or more was improved. In addition, since the standard reference component did not contain insulating materials, such as Si/SiO$_2$, there was no effect of electrification and measurement reproducibility of the pitch size was improved to 0.5 nm or less.

As described above in detail, since the standard reference has materials that do not cause impurity contamination to silicon, even if it is mounted on the same stage as that for the silicon wafer, the silicon wafer is not contaminated. Moreover, thanks to this feature, a standard reference component that contains no impurity and is in the form of a wafer can be realized by implanting the cross-section in a silicon wafer, subsequently polishing the surface to flatten the cross-section part and the substrate part, and finally conducting material selecting etching to fabricate a standard reference component.

For this reason, it is possible to perform calibration by conveying the standard reference component to a scanning electron microscope like the measuring wafer, which makes it also possible to perform comparison calibration among a plurality of apparatuses.

Moreover, since the lamination structure of the present invention is all made of the electroconductive materials, it is possible to perform stable calibration free from an electrification phenomenon in the measurement with the scanning electron microscope.

Furthermore, since in the lamination structure of silicon/molybdenum (Si/Mo), the difference of atomic number between silicon and molybdenum that are the materials of the lamination differs largely compared with a GaAs lamination or a Si/SiO$_2$ lamination, contrast of secondary electron signal between the silicon layer and the molybdenum layer is distinct, which enables high-precision period measurement.

What is claimed is:

1. A standard reference component for calibration for calibrating a scanning electron microscope that measures a pattern in an observation area from information on the intensity of secondary electrons or reflected electrons generated by scanning an incident electron beam in the observation area on a measuring sample, comprising:
    a first substrate on which a multiple-layer is laminated; and
    a second substrate with a recess for holding the first substrate on its surface,
    wherein the first substrate is held in the recess of the second substrate so that a normal direction of the multiple-layer surface may be roughly perpendicular to a normal direction of the second substrate, and
    the multiple-layer has a multiple-layer structure of a film containing silicon and a film containing molybdenum.

2. The standard reference component for calibration according to claim 1,
    wherein the multiple-layer is fabricated to have a lamination structure in which a film containing silicon and a film containing molybdenum are alternately arranged periodically at a fixed pitch and a pitch size is obtained in advance by light- or X-ray diffraction.

3. The standard reference component for calibration according to claim 2,
    wherein the second substrate has the form of a silicon wafer, and the multiple-layer is implanted in the silicon wafer so that the cross-section of the multiple-layer held in the recess of the second substrate may become substantially the same plane as the surface of the silicon wafer.

4. The standard reference component for calibration according to claim 2,
    wherein the multiple-layer structure is a periodic convex pattern of the molybdenum films or the silicon films.

5. The standard reference component for calibration according to claim 1,
    wherein the second substrate has the form of a silicon wafer and has a structure in which the multiple-layer is implanted in a silicon wafer so that a cross-section of the multiple-layer held in the recess of the second substrate may become substantially the same plane as the surface of the silicon wafer.

6. The standard reference component for calibration according to claim 5,
    wherein the multiple-layer structure is a periodic convex pattern of the molybdenum films or the silicon films.

7. The standard reference component for calibration according to claim 1,
    wherein the multiple-layer structure is a periodic convex pattern of the molybdenum films or the silicon films.

8. A fabrication method for a standard reference component for calibration, comprising the steps of:
    forming a multiple-layer structure of a silicon film and a molybdenum film by alternately arranging the two films periodically at a fixed pitch;
    implanting a crystal cross-section of the multiple-layer structure in a recess formed on the surface of a silicon wafer with an electroconductive adhesive;
    polishing the surface of the silicon wafer in which a crystal cross-section of the multiple-layer structure is implanted; and
    conducting material selecting etching on the crystal cross-section of the multiple-layer structure after the polishing step and forming it into a pattern form of a one-dimensional diffraction grating.

9. The fabrication method for a standard reference component for calibration according to claim 8,
    wherein the multiple-layer structure is a periodic convex pattern of the molybdenum films or the silicon films.

10. A scanning electron microscope, comprising:
    a sample stage for holding a sample;
    an irradiation optical system for scanning an electron beam in the sample on the sample stage;
    a detector for detecting secondary electrons or reflected electrons generated by electron beam scanning;
    signal processing means for measuring a length of the sample by processing an electronic signal obtained from the detector;
    display means for displaying the length measurement result; and
    a standard reference component for calibration used for performing magnification calibration of the irradiation optical system,
    wherein the standard reference component for calibration substantially consists of a first substrate on which a multiple-layer is laminated and a second substrate with a recess for holding the first substrate on its surface,
    the first substrate is held in the recess of the second substrate so that a normal direction of the multiple-layer surface may be roughly perpendicular to a normal direction of the second substrate, and
    the multiple-layer has a multiple-layer structure of a film containing silicon and a film containing molybdenum.

11. The scanning electron microscope according to claim 10,
    wherein the multiple-layer has a lamination structure in which a film containing silicon and a film containing molybdenum are alternately arranged periodically at a fixed pitch and the pitch size is obtained in advance by light- or X-ray diffraction.

12. The scanning electron microscope according to claim 11,
    wherein the standard reference component for calibration is mounted on the sample stage.

13. The scanning electron microscope according to claim 11,
    wherein a pitch size of either one of films obtained by the signal processing means and a pitch size that is obtained in advance by the light- or X-ray diffraction are compared and magnification calibration of the irradiation optical system is performed so that the difference may become substantially zero.

14. The scanning electron microscope according to claim 13,
    wherein the standard reference component for calibration is mounted on the sample stage.

15. The scanning electron microscope according to claim 10,
    wherein the standard reference component for calibration is mounted on the sample stage.

* * * * *